US005844586A

United States Patent [19]

[11] Patent Number: 5,844,586

[45] Date of Patent: Dec. 1, 1998

Berry et al.

[54] PROCESS FOR MAKING INK JET HEATER CHIPS

[75] Inventors: Karen L. Berry, Pawlet, Vt.; Joseph P. Maniaci, Sayville, N.Y.

[73] Assignee: Standard Microsystems Corporation, Hauppauge, N.Y.

[21] Appl. No.: 628,059

[22] Filed: Apr. 8, 1996

[51] Int. Cl.[6] ............................. B41J 2/05; H01L 29/76; H01L 29/00

[52] U.S. Cl. ........................... 347/59; 257/379; 257/537; 347/64

[58] Field of Search ........................ 347/59, 64; 257/379, 257/537

[56] References Cited

U.S. PATENT DOCUMENTS

| | | | |
|---|---|---|---|
| 5,122,812 | 6/1992 | Hess et al. | 347/59 |
| 5,159,353 | 10/1992 | Fasen et al. | 347/59 |

*Primary Examiner*—Brian M. Burn
*Assistant Examiner*—J. Parsa
*Attorney, Agent, or Firm*—Hopgood, Calimafde, Kalil & Judlowe, LLP

[57] ABSTRACT

A process is disclosed for fabricating a thermal inkjet printhead in which the driving circuitry and heating resistors are incorporated in a single integrated circuit. In the process, a protective cavitation layer, which may contain tantalum, is deposited at the locations of the heating regions over a passivation layer and is then patterned prior to any patterning or etching of the passivation layer. A via is then formed in the passivation layer.

7 Claims, 4 Drawing Sheets

PROCESS FOR MAKING INK JET HEATER CHIPS

BACKGROUND OF THE INVENTION

The present invention relates generally to thermal inkjet printing, and more particularly to a thermal inkjet printhead and a process for its fabrication.

In recent years, there has been a marked increase in the use of high-resolution, high-speed printers that has accompanied the increased use of PCs. Many printers now sold for use with PCs utilize a thermal inkjet printhead in which reservoirs of ink are in communication with a heating element, typically a resistor. Driver logic circuitry selectively applies drive signals to the resistors, which, when selectively activated in this manner, are heated. This heating of the resistors in turn causes heating and expulsion of the ink from their associated reservoirs onto an adjacent recording medium so as to print high-resolution dots on the medium. The dots selectively formed in this manner typically form high-resolution alphanumeric symbols at a high speed.

As disclosed, for example, in U.S. Pat. Nos. 4,719,977; 5,122,812; 5,159,353 and 5,075,250, it is now possible through the use of MOS technology, to form the driver logic circuitry, which includes MOS transistors, on a common substrate and integrated circuit with the resistors. In the fabrication of a monolithic inkjet printhead of this type, in a known process, an MOS transistor is fabricated on a surface of a substrate and is surrounded by a thick field oxide layer. The field oxide layer is covered with a layer of protective dielectric material, which, in turn, is covered by a stacked metal layer that includes a thin layer of resistive heater material such as an aluminum-tantalum alloy and an overlying, thicker conductive (e.g. aluminum) layer, which is then patterned to form a resistor at the heater region.

Thereafter, a layer of protective passivation, typically a combination of a layer of silicon nitride ($Si_3N_4$) and a layer of silicon carbide, (SiC), is applied over the entire device. The passivation layer is then patterned and etched to form a via opening to the underlying conductive metal layer after which a layer, such as of tantalum and gold, is deposited over the patterned passivation layer, such that a portion of the tantalum layer extends through the via to contact the underlying previously deposited conductive layer. Thereafter the tantalum and gold layers are patterned and etched, such that the portion of the tantalum layer that is to serve, as the cavitation layer for the heater region is exposed, that is, free of any overlying aluminum-copper alloy, whereas the portion of the gold layer that remains defines the location of a bond pad and interconnect.

It has been found that in this process, in which the passivation layer is patterned and etched by the conventional use of a photoresist and subsequent etching to form the vias prior to the deposition and formation of the cavitation layer, the upper surface of the passivation layer is damaged by contamination such that when the cavitation layer is subsequently formed over the passivation layer and is subjected to the temperatures normally achieved in a printing operation, the underlying passivation layer tends to crack and the cavitation layer tends to lose adhesion and become free of the passivation layer. This often leads to a premature failure of the printhead.

SUMMARY OF THE INVENTION

It is therefore an object of the invention to provide a method for fabricating an inkjet printhead which is more reliable and which operates over a longer period of time.

It is a more general object of the invention to provide a more reliable thermal inkjet printhead and a process for its manufacture.

It is a more specific object of the invention to provide an inkjet printhead and a process for its manufacture in which improved adhesion of the cavitation layer and a corresponding greater reliability are achieved.

In accordance with the invention, in addition to the formation of driver control transistors and a resistive heating layer connected to the transistors to establish potential heating regions, and the deposition of a passivation layer over the heating layer, a conductive protective layer is deposited over the passivation layer and is patterned and etched prior to carrying out any photolithographic or etching step on the passivation layer. That is, the protective layer is deposited over the upper surface of the passivation layer immediately following the deposition of the passivation layer, and is then patterned and etched to form a cavitation layer at each of the heater regions. The passivation layer is thereafter patterned and etched to open vias therein. A second conductive layer is then deposited over the patterned passivation layer and is patterned and etched to define bond pad areas and interconnect. The printhead is completed by the formation of a thick film and a nozzle plate, which are patterned to define ink reservoirs at the locations of the cavitation layers and associated heating regions.

BRIEF DESCRIPTION OF THE DRAWINGS

To the accomplishment of the foregoing and further objects which may hereinafter appear, the present invention relates to an improved inkjet printhead and a process for its fabrication, substantially as described in the following detailed description of a preferred embodiment as considered along with the accompanying drawings in which.

DETAILED DESCRIPTION OF A PREFERRED EMBODIMENT

Figure 1:
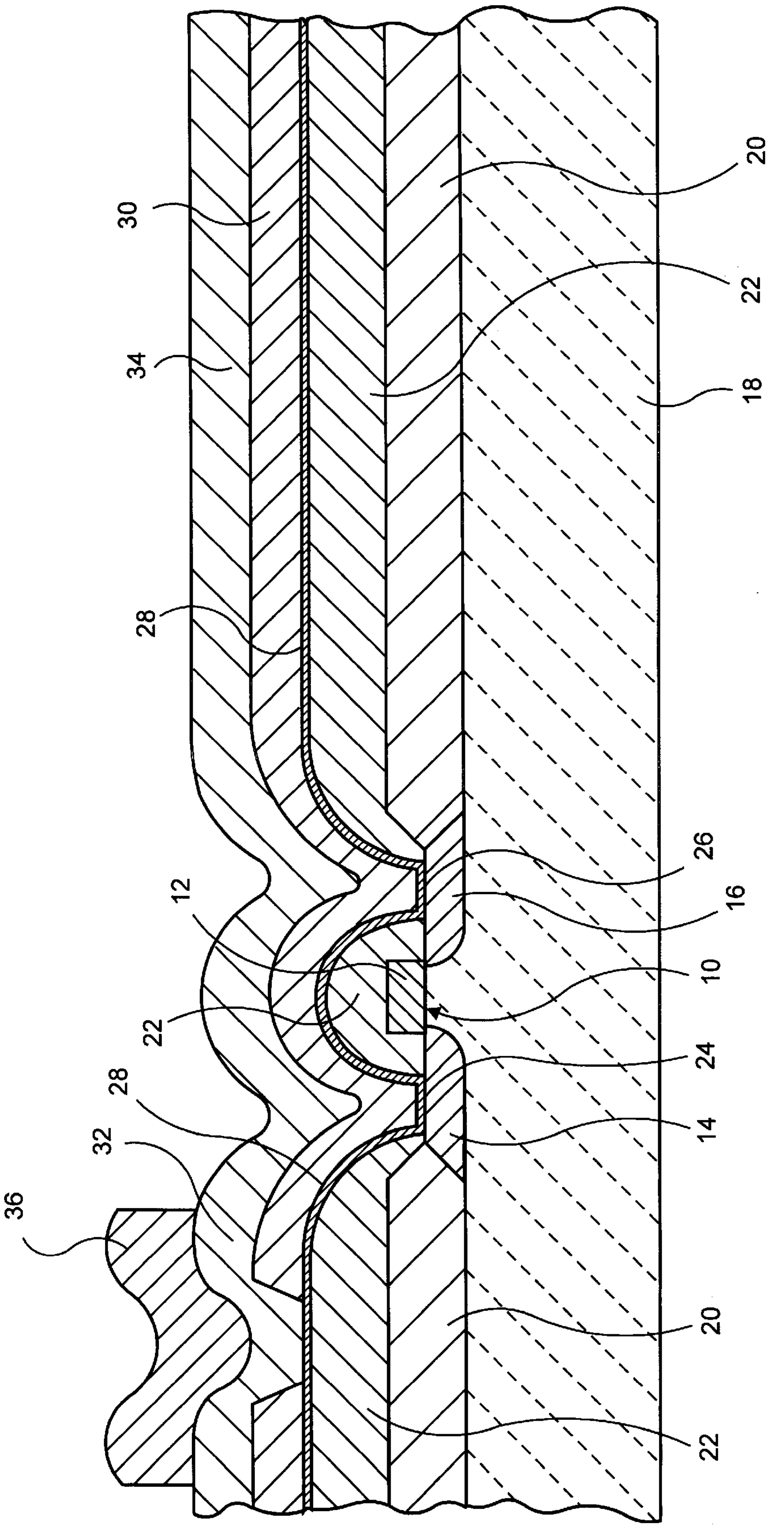
FIGS. 1–4 are cross-sectional views illustrating a thermal inkjet printhead during various stages of its fabrication in accordance with the process, with the completed product being illustrated in FIG. 4.

FIGS. 1–4 illustrate the fabrication of a thermal inkjet printhead by a process according to a presently preferred embodiment of the invention. As shown in FIG. 1, which at this stage of the process follows a conventional process, an MOS transistor 10, which includes a polysilicon gate 12, a source 14 and a drain 16, is formed in a conventional manner in a substrate 18. For illustrative purposes, the substrate is of p-type conductivity, whereas the source and drain diffusions are of n-type conductivity. As described, for example, in U.S. Pat. No. 5,122,812 referred to above, MOSFET 10 is a part of the driver circuitry of the printhead. As is also conventional, the MOS transistor is surrounded by a thick oxide layer 20, which, in turn, is covered by a layer 22 of protective dielectric material such as boron and phosphorous doped glass, which is nominally between 5000 Å and 10,000 Å in thickness.

Thereafter, as shown in FIG. 1, contact holes 24, 26 are formed in dielectric layer 22 as by plasma etching or by wet etch techniques, to allow contact to be made to the source 14 and drain 16 of FET 10. A stacked layer metallurgy consisting of layers 28 and 30 is then sputter deposited over the device. Layer 28, which is of electrically resistive material, makes electrical contact through contact holes 24, 26 to the source and drain, respectively, and also to the polysilicon gate 12 of transistor 10. Layer 28, which serves as the resistive heating element of the printhead, preferably consists of a tantalum-aluminum alloy nominally 1000 Å in thickness. The ratio of tantalum to aluminum in the resistive alloy layer 28 may preferably range from 40–60 atomic percent to 60–40 atomic percent.

The first conductive layer 30, which is preferably deposited in situ by sputtering over resistive alloy layer 28, is advantageously an alloy of aluminum and copper having a nominal thickness of 5200 Å in which the percentage of copper by weight in the alloy varies from 1 to 5 percent, and is preferably 4 percent. Alternatively, conductive layer 30 may be an alloy of aluminum, copper and silicon, in which the percentage of copper by weight varies from 0.5 to 4 weight percent, and that of silicon varies between 0.5 and 2 weight percent. Alternatively, layer 28 may be formed of hafnium diboride (1000 Å in thickness), and conductive layer 30 may be formed in a stack of a titanium (10%–90%) tungsten mixture (600 Å in thickness) covered by an aluminum alloy layer. The aluminum alloy of layer 30 may be A1-X weight percent Cu (where X ranges from 1 to 5), or A1-X weight percent-Cu-Y weight percent Si (where X can range from 1 to 5 and Y can range from 0.5 to 2). Where the aluminum alloy layer 30 is in place the patterned metallurgy functions as a conductive material; where only the resistive material layer 28 is in place, it functions as a heater that is utilized in the expulsion of the ink drop.

Thereafter, as shown in FIG. 1, the metal conducting layer 30 is patterned using conventional photolithographic techniques and then etched to form an opening 32 that establishes the location of a heating region. The etching of conductive layer 30 may be done by the use of a wet spin etch or any standard/plasma or wet etching technique.

A protective passivation layer 34 is then applied over the entire device. Layer 34 preferably consists of two films; the first film deposited is silicon nitride ($Si_3N_4$) of 4500 Å nominal thickness using PECVD technology; the second layer deposited is silicon-carbide (SiC) of 2600 Å nominal thickness also using PECVD technology. A portion of layer 34 extends through opening 32 to contact the exposed surface of resistive layer 28.

Figure 2:
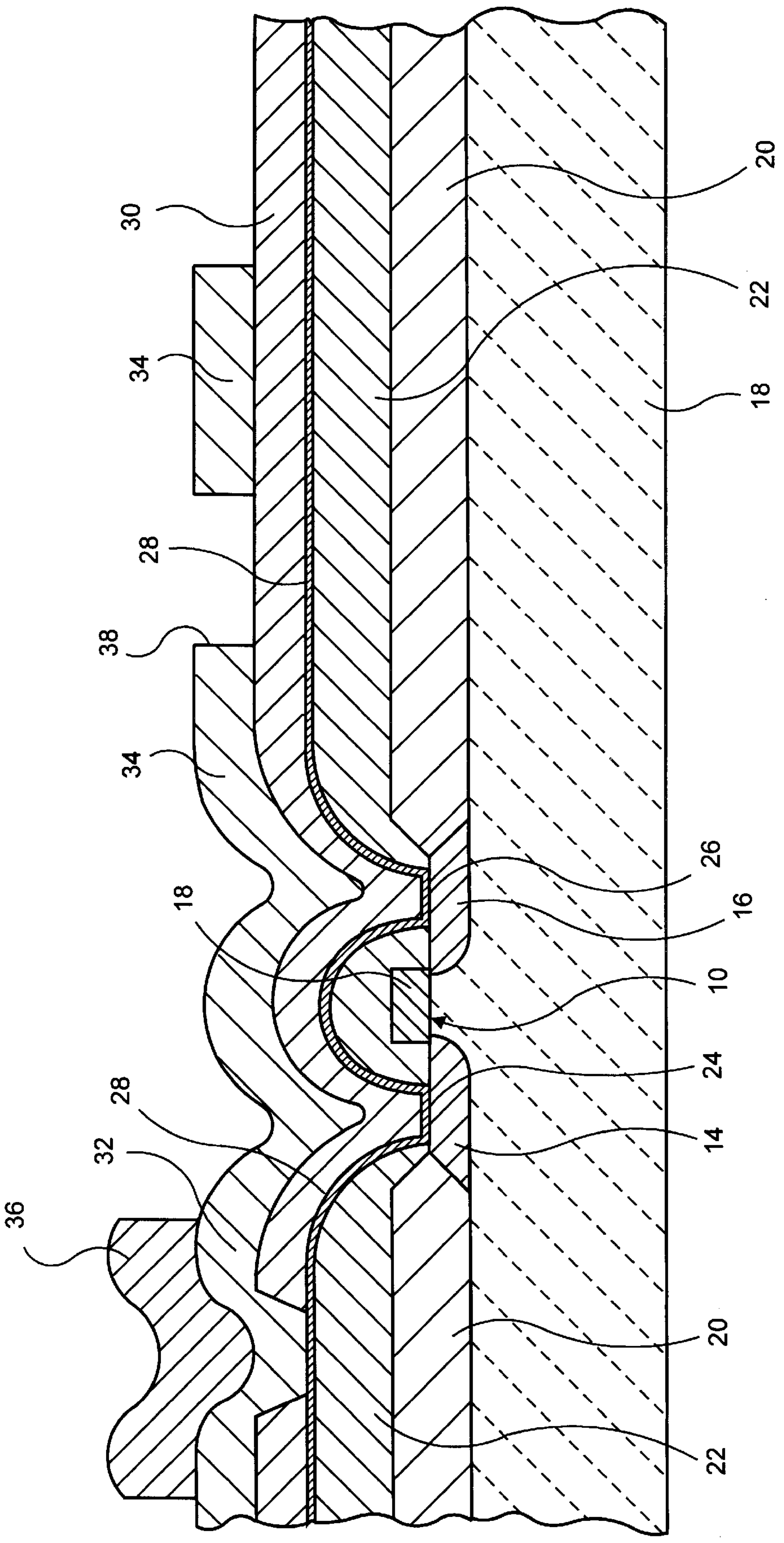

In accordance with the present invention, immediately thereafter, as shown in FIG. 2, that is before any photolithographic or etching operation is carried out on passivation layer 34, an additional protective layer 36, preferably of tantalum, is applied as by deposition over the protective passivation layer 34. Layer 36, which, after patterning acts as an electrically conductive cavitation layer, is preferably deposited using conventional sputtering technology of B-phase—Ta (6000 Å in nominal thickness). Cavitation layer 36, as is known, provides protection to the heater region and to the passivation layer 34.

The tantalum protective layer 36 is then patterned, preferably by the use of standard photolithographic technology, and subsequently etched, such as by the use of a combination of plasma and wet etching. It has been found desirable to etch layer 36 by the use of plasma etching followed by wet etching. After the cavitation layer 36 is defined in this manner, vias (or contact windows) 38 to the first metal conductive layer 30 are opened up in the passivation layer 34 by the use of a standard plasma etch.

It has been found that this sequence of patterning and etching the cavitation layer prior to the patterning and etching of the passivation layer significantly enhances the adhesion of the tantalum cavitation layer 36 to the passivation layer and accordingly adds greatly to the reliability and useful life of the inkjet printhead.

Figure 3:
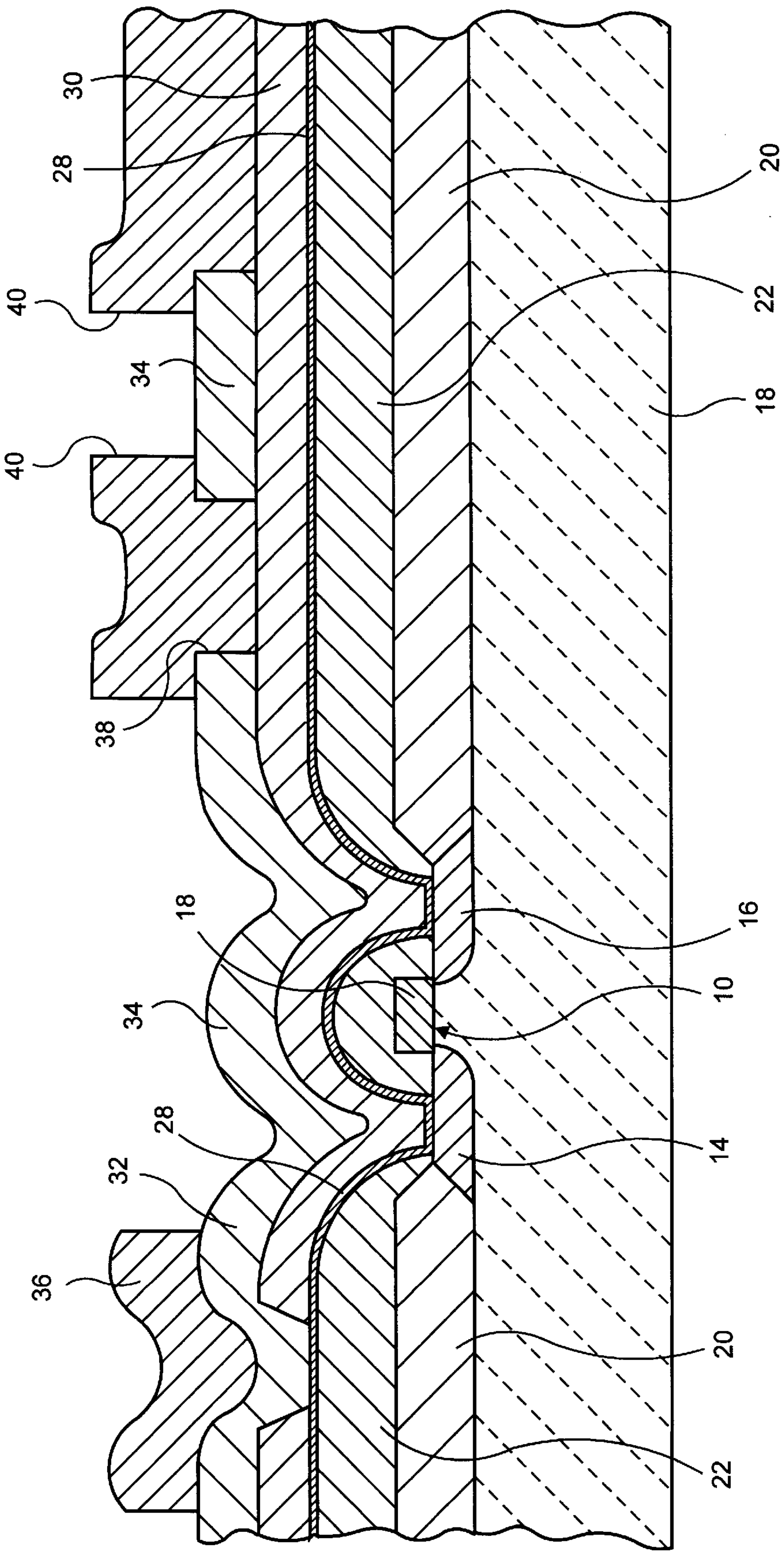

Thereafter, as shown in FIG. 3, a second conductive metal layer 40 is deposited over the entire device preferably by the sputter deposition of either aluminum or an aluminum-copper alloy. If an alloy of aluminum and copper is used in the second conductive layer, the weight percent of copper may range from 1 to 5 percent, and is preferably 4 percent. It is to be understood that the metal of layer 40 is not limited to aluminum or an aluminum alloy but that any conducting material may be used. The nominal thickness of the second conductive metal layer 40 is 10.4K Å. An "in-situ" plasma pre sputter etch is preferably used prior to the sputtering of the aluminum alloy.

Thereafter, the metal layer 40 is patterned using conventional photolithographic techniques. The etching of layer 40 can be done using either standard plasma or wet etching techniques. A wet spin etch is preferably used for this purpose. Optionally, bonding pads may be opened down to the metal layer 30 by an etching technique using standard plasma chemistries.

Figure 4:
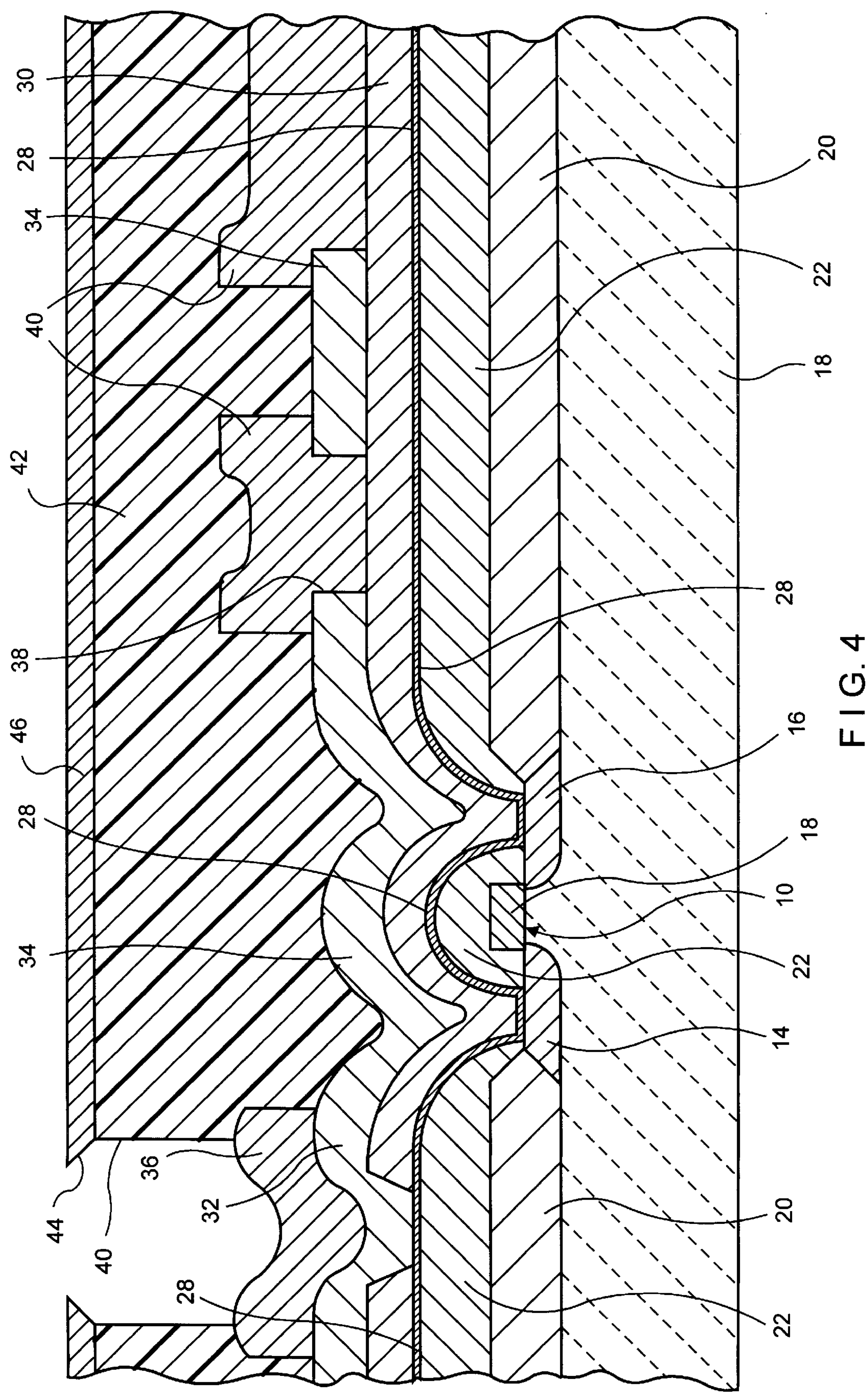

Thereafter, as shown in FIG. 4, the entire device is covered with a thick film 42 of between 200,000 and 300,000 Å in thickness. Film 42 is preferably made of an organic polymer plastic that is substantially inert to the corrosive action of ink, and is preferably formed by a conventional lamination technique. Layer 42 is then patterned and etched to form an opening 44 above the cavitation layer 36 and heating region. Opening 44 acts as the reservoir for the ink, which when heated is expelled from the reservoir through an opening 46 formed in a nozzle or orifice plate 48, which is aligned with ink reservoir 44. Nozzle 48, which is conventional, is preferably made of nickel and is applied over the upper surface of the film 42, controls both the drop volume and the direction of the ink.

The process of this invention, and particularly the formation of the underlying cavitation layer prior to any photolithographic or etching of the passivation layer, has been found to result in improved reliability of performance of the cavitation layer during heating firing and ink drop emission over the useful life of the inkjet printhead fabricated by the process. It will be understood that although the present invention has been described with regard to a presently preferred embodiment, further modifications may be made to this process without necessarily departing from the spirit and scope of the invention.

What is claimed is:

1. A process for fabricating a thermal inkjet printhead comprising the steps of:

providing a substrate;

forming a transistor in said substrate;

forming a layer of resistive material and an overlying conductive layer over said transistor;

patterning and etching said conductive layer to expose a portion of said resistive material layer at a heating region;

establishing electrical contact of said resistive material layer to at least one terminal of said transistor;

forming a passivation layer over said conductive layer and the exposed portion of said resistive layer;

thereafter forming a protective layer over said passivation layer;

thereafter, patterning and etching said protective layer to form a cavitation layer at the location of said heating region; and thereafter patterning and etching said passivation layer to form a via extending to said conductive layer.

2. The process of claim 1, in which said cavitation layer is tantalum and said passivation layer includes layers of silicon nitride and silicon carbide.

3. The process of claim 1, further comprising the step of depositing a second conductive layer after the formation of said via, said second conductive layer extending through said via to make contact with said first conductive layer.

4. The process of claim 3, in which said first conductive layer comprises an aluminum alloy, and said second conductive layer includes aluminum or an aluminum-copper alloy.

5. The process of claim 1, further comprising the step of forming an opening in said conductive layer to said resistive layer, said cavitation layer being in alignment with said opening.

6. A thermal inkjet printhead fabricated according to the process of any of claims 1–5.

7. A printer cartridge including the thermal inkjet printhead of claim 6.

* * * * *